(12) United States Patent
Rahman et al.

(10) Patent No.: US 7,619,441 B1
(45) Date of Patent: Nov. 17, 2009

(54) APPARATUS FOR INTERCONNECTING STACKED DICE ON A PROGRAMMABLE INTEGRATED CIRCUIT

(75) Inventors: Arifur Rahman, San Jose, CA (US); Bernard J. New, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 12/041,612

(22) Filed: Mar. 3, 2008

(51) Int. Cl.
*H03K 19/173* (2006.01)

(52) U.S. Cl. .......................................... 326/38; 326/40

(58) Field of Classification Search ............... 326/37–41
See application file for complete search history.

(56) References Cited

U.S. PATENT DOCUMENTS

| | | | |
|---|---|---|---|
| 6,747,479 B1 * | 6/2004 | Coppola et al. ............... 326/41 |
| 6,875,921 B1 * | 4/2005 | Conn ......................... 174/534 |
| 7,062,586 B2 * | 6/2006 | Donlin et al. ................ 710/305 |
| 7,068,072 B2 * | 6/2006 | New et al. ..................... 326/47 |
| 7,135,888 B1 * | 11/2006 | Hutton et al. ................. 326/41 |

OTHER PUBLICATIONS

Rahman, Arifur et al., "Die Stacking Technology for Terabit Chip-to-Chip Communications", Proceedings of 2006 IEEE Custom Integrated Circuits Conference (CICC), Sep. 10-13, 2006, available from IEEE, 3 Park Avenue, 17th Floor, New York, NY 10016-5997.
U.S. Appl. No. 11/973,062, filed Oct. 4, 2007, Rahman, Arifur et al., entitled "Integrated Circuit with Through-Die Via Interface for Die Stacking", Xilinx, Inc. 2100 Logic Drive, San Jose, CA 95124.

* cited by examiner

*Primary Examiner*—Don P Le
(74) *Attorney, Agent, or Firm*—Robert M. Brush; Thomas George

(57) ABSTRACT

An apparatus for interconnecting stacked dice on a programmable integrated circuit is described. In one example, an integrated circuit die comprises a programmable integrated circuit that includes first and second interface tiles. The first interface tile is in electrical communication with a first array of pins on the integrated circuit die, and the second interface tile is in electrical communication with a second array of pins on the integrated circuit die. At least one dedicated routing resource is formed on the integrated circuit die between the first interface tile and the second interface tile. The at least one dedicated routing resource is configured to couple at least one pin of the first array of pins to at least one pin of the second array of pins.

20 Claims, 4 Drawing Sheets

APPARATUS FOR INTERCONNECTING STACKED DICE ON A PROGRAMMABLE INTEGRATED CIRCUIT

FIELD OF THE INVENTION

One or more aspects of the present invention relate generally to integrated circuits and, more particularly, to an apparatus for interconnecting stacked dice on a programmable integrated circuit.

BACKGROUND

Programmable logic devices (PLDs) exist as a well-known type of programmable integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The programmable interconnect structure (also referred to as a routing fabric) typically includes conductors of various lengths interconnected by programmable switches (referred to as programmable routing resources). For example, some types of conductors may span two CLBs (referred to as doubles), while other types of conductors may span six CLBs (referred to as hexes). The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

As semiconductor technology has advanced, the amount and speed of logic available on an IC, such as an FPGA, has increased more rapidly than the number and performance of I/O connections. As a result, IC die stacking techniques have received renewed interest to address the interconnection bottleneck of high-performance systems. In stacked IC applications, two or more ICs are stacked vertically and interconnections are made between them. The stacked ICs may be digital, analog, or mixed-signal ICs, or a combination thereof. The FPGA may be used as a computational platform for the ICs, as well as to provide interconnections between the stacked ICs.

Notably, interconnections between stacked ICs may be made through the FPGA using the FPGA routing fabric. However, signal delays of paths constructed using FPGA routing resources can vary significantly from one type of resource to another. Thus, the FPGA routing fabric generally does not provide for creation of low-skew busses between stacked ICs. Moreover, the availability of programmable routing resources also depends on the design being implemented in the FPGA. As a result, there is no guarantee that a low-skew bus can be implemented between stacked ICs using the available routing resources. Accordingly, there is a need in the art for improved interconnections between stacked dice on a programmable logic device.

SUMMARY

An apparatus for interconnecting stacked dice on a programmable integrated circuit is described. In one embodiment, an integrated circuit die is provided that comprises a programmable integrated circuit (e.g., a programmable logic device, or PLD). The programmable integrated circuit includes first and second interface tiles. The first interface tile is in electrical communication with a first array of pins on the integrated circuit die, and the second interface tile is in electrical communication with a second array of pins on the integrated circuit die. At least one dedicated routing resource is formed on the integrated circuit die between the first interface tile and the second interface tile. The at least one dedicated routing resource is configured to couple at least one pin of the first array of pins to at least one pin of the second array of pins.

In another embodiment, a first integrated circuit die is provided that comprises a programmable integrated circuit (e.g., a PLD). An interposer is mounted on the integrated circuit die. A second integrated circuit die is vertically stacked on the interposer. A third integrated circuit die is vertically stacked on the interposer. At least one dedicated routing resource is formed on the interposer configured to electrically couple the second integrated circuit and the third integrated circuit.

In another embodiment, an integrated circuit die is provided that comprises a programmable integrated circuit (e.g., a PLD). The programmable integrated circuit includes a first interface tile and a second interface tile. An interposer is mounted on the integrated circuit die. At least one dedicated routing resource is formed on the interposer configured to electrically couple the first interface tile and the second interface tile.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION OF THE DRAWINGS

The present invention is applicable to a variety of integrated circuits (ICs). The present invention has been found to be particularly applicable and beneficial for programmable integrated circuits such as programmable logic devices (PLDs). An appreciation of the present invention is presented by way of specific examples utilizing PLDs such as field programmable gate arrays (FPGAs). However, the present invention is not limited by these examples, and can be applied to virtually any IC that includes programmable resources.

Figure 1:
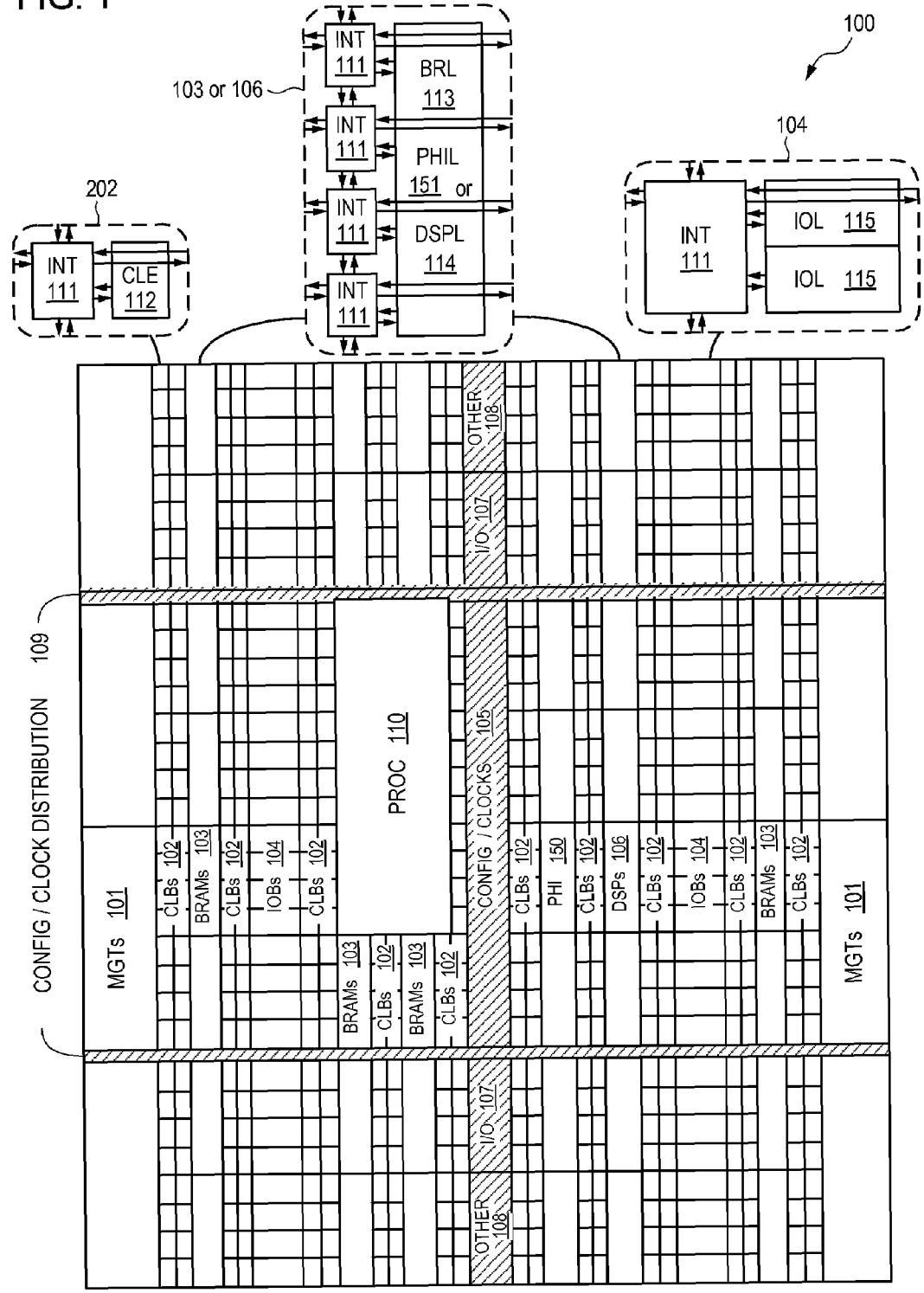
FIG. 1 is a block diagram depicting an exemplary embodiment of an FPGA in accordance with one or more aspects of the invention.

FIG. 1 is a block diagram depicting an exemplary embodiment of an FPGA 100 in accordance with one or more aspects of the invention. The FPGA 100 includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110). The FPGA 100 also includes one or more programmable heterogeneous integration (PHI) tiles 150. In some embodiments, the FPGA 100 includes a plurality of PHI tiles 150 arranged in a column. The PHI tiles 150 facilitate interconnection to one or more other ICs stacked on the die of the FPGA 100. The PHI tiles 150 are discussed in detail below.

In some FPGAs, each programmable tile includes a programmable interconnect element (INT 111) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 111) also includes the connections to and from the programmable logic element within the same tile, as shown by the examples included at the top of FIG. 1. The programmable interconnect element (INT 111) may also include connections via routing conductor segments to and from a corresponding interconnect element that span multiple columns of logic. That is, routing conductor segments may span a plurality of tiles (e.g., a "hex" line spans six tiles).

For example, a CLB 102 can include a configurable logic element (CLE 112) that can be programmed to implement user logic plus a single programmable interconnect element (INT 111). The CLE 112 includes one or more slices of logic (not shown). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements (e.g., four are shown). A PHI tile 150 includes a PHI logic element (PHIL 151) in addition to an appropriate number of programmable interconnect elements (e.g., four are shown). In addition, a PHI tile 150 may be coupled to one or more dedicated routing resources, as described below. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs is typically included wherever the CLBs appear, to facilitate the efficient implementation of user logic. Examples of FPGAs that may be used with embodiments of the invention are the Virtex™-4 FPGAs available from Xilinx, Inc., of San Jose, Calif.

Figure 2:
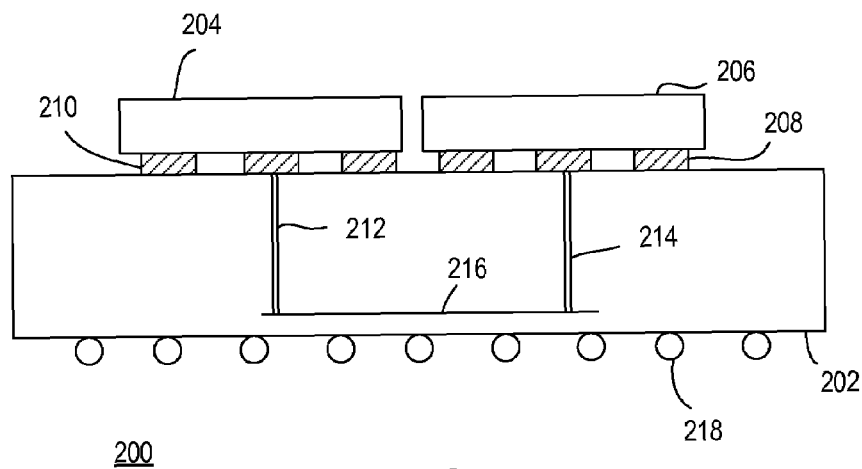
FIG. 2 is a cross-sectional view showing an exemplary embodiment of a first semiconductor device in accordance with one or more aspects of the invention.

FIG. 2 is a cross-sectional view showing a first exemplary embodiment of a semiconductor device 200 in accordance with one or more aspects of the invention. The semiconductor device 200 includes an FPGA die 202, a second die 204, and a third die 206. The FPGA die 202 may be configured in accordance with the FPGA architecture 100 shown in FIG. 1, for example. Each of the second die 204 and the third die 206 may comprise any type of digital, analog, or mixed-signal IC. The second die 204 and the third die 206 are vertically stacked with the FPGA die 202. In some embodiments, each of the die 202, 204, and 206 is configured for face-down mounting in flip-chip fashion. The term "face side" denotes the side of a die that receives the bulk of semiconductor processing such that circuitry is fabricated on that face side of the die. The side of a die opposite the face side is referred to as the backside of the die. Thus, the face side of the second die 204, and the face side of the third die 206, may be mounted to the backside of the FPGA die 202. In other embodiments, the second die 204 and the third die 206 may be mounted face-down on the face side of the FPGA die 202.

In particular, each of the second die 204 and the third die 206 includes circuitry formed on a semiconductor substrate. The second die 204 and the third die 206 also include conductive interconnect formed over the circuitry, as is conventionally known in the art. The FPGA die 202 includes circuitry formed on a semiconductor substrate and conductive interconnect formed over the circuitry. The FPGA die 202 also includes an array of bump contacts 218 formed on the face side for flip-chip mounting to a carrier. The FPGA die 202 includes an array of contacts 210 and an array of contacts 208, each formed on the backside thereof. The contacts 210 and 208 are also referred to as "pins." The second die 204 is electrically and mechanically coupled to the contacts 210. The third die 206 is electrically and mechanically coupled to the contacts 208. The FPGA die 202 further includes through-die vias (TDVs 212, 214) extending from the backside thereof to the conductive interconnect on the face side thereof. The width of the TDVs depends on the thickness of the semiconductor substrate of the FPGA die 202. For example, for substrates ranging from 10 μm to 100 μm, the width of TDV 214 may range between 2 μm and 15 μm. Fabrication of the TDVs is well known in the art.

For example, a TDV 212 and a TDV 214 are shown. The TDV 212 electrically couples to one of the contacts 210 on the backside of the FPGA die 202 to a portion 216 of the conductive interconnect. The TDV 214 electrically couples one of the contacts 208 to the portion 216 of the conductive interconnect. In this manner, the TDV 212, the portion 216 of the conductive interconnect, and the TDV 214 electrically couple the second die 204 and the third die 206. In other words, the FPGA die 202 provides an electrical interconnection for the die 204 and the die 206 stacked on the FPGA die 202. The portion 216 of the conductive interconnect comprises a dedicated routing resource in the FPGA die 202, rather than a portion of the programmable interconnect of the FPGA die 202. Thus, multiple instances of the portion 216 can be used to provide for low-skew communication between the dice 204 and 206. Although only two dice are shown stacked on the FPGA die, those skilled in the art will appreciate that more than two dice may be stacked on the FPGA die and any combination of such stacked dice may be coupled using dedicated routing resources formed in the FPGA die. Exemplary embodiments of dedicated routing resources are described below.

Returning to FIG. 1, the FPGA architecture 100 includes multiple columns of logic, including CLB columns, DSP columns, BRAM columns, IOB columns, and the like. In the embodiment shown, the FPGA architecture 100 also includes a column of PHI tiles 150. Although only a single column of PHI tiles 150 is shown, it is to be understood that the FPGA architecture 100 may generally include one or more columns of PHI tiles 150. The PHI tile 150 generally includes circuitry and TDVs for providing an interface between the FPGA and one or more additional ICs mounted to the backside of the FPGA.

Figure 3:
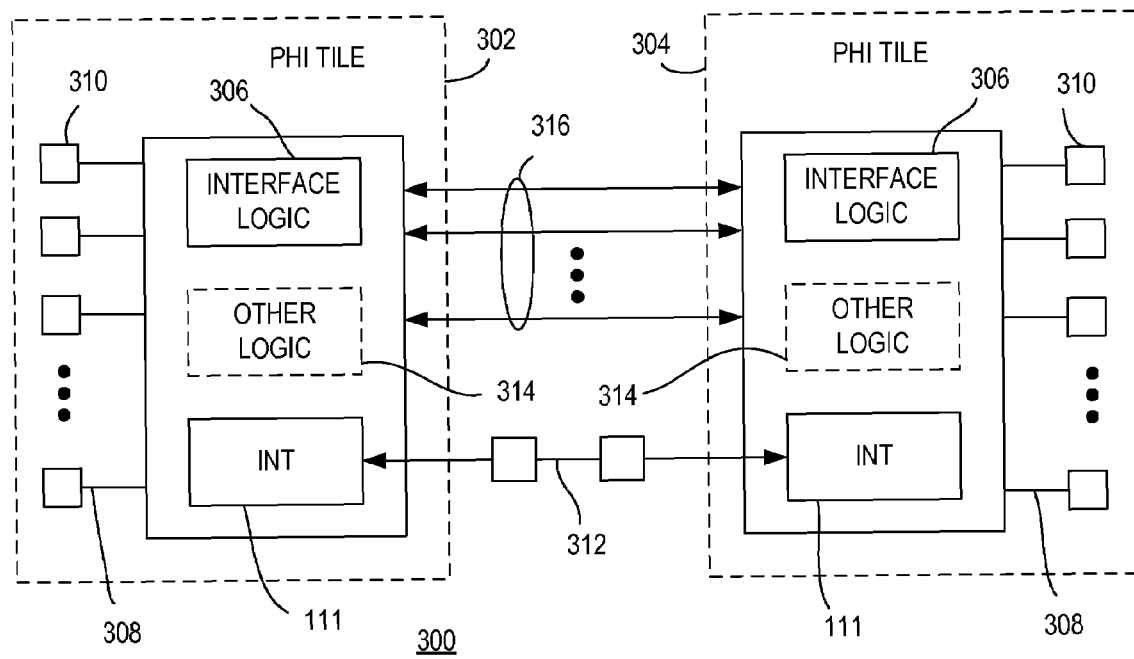
FIG. 3 is a block diagram depicting an exemplary embodiment of a pair of connected interface tiles in accordance with one or more aspects of the invention.

FIG. 3 is a block diagram depicting an exemplary embodiment of a pair 300 of connected PHI tiles in accordance with one or more aspects of the invention. The pair 300 includes a PHI tile 302 and a PHI tile 304. Each of the PHI tiles 302 and 304 includes interface logic 306, programmable interconnect elements 111, TDVs 308, and pins 310. The pins 310 are formed on the FPGA die, as described above. The TDVs 308 electrically couple the pins 310 to the interface logic 306 of the PHI tiles 302 and 304. The interface logic 306 may include registers, three-state buffers, and the like for receiving and providing signals. The interface logic 306 may be coupled to the FPGA programmable interconnect via the programmable interconnect elements 111. Each of the programmable interconnect elements 111 includes programmable multiplexing structures that couple the PHI tiles 302 and 304 to the routing resources of the FPGA programmable interconnect, such as a routing resource 312. The routing resource 312 may include conventional double, hex, and/or long lines along with various programmable routing multiplexers. Each of the PHI tiles 302 and 304 may also include other logic 314, such as level translation logic, test logic, configurable slice logic, and the like.

In accordance with one aspect of the invention, the interface logic 306 is also coupled to one or more dedicated routing resources 316. The dedicated routing resources 316 facilitate communication between the PHI tile 302 and the PHI tile 304 and may provide a low-skew path between stacked dice coupled to the pins 310. By "dedicated" it is meant that the routing resources 316 are independent of the conventional programmable interconnect in the FPGA in that the dedicated routing resources 316 do not use any conductor segments, programmable switches, programmable multiplexers, or the like of the FPGA interconnect. Each of the dedicated routing resources 316 may be a digital connection, an analog connection, or a radio frequency (RF) connection between the PHI tiles 302 and 304. Furthermore, the dedicated routing resources 316 may be programmable, as described in the embodiments below. The dedicated routing resources 316 may comprise conductors formed in one or more layers of the conductive interconnect of the FPGA die.

Figure 4:
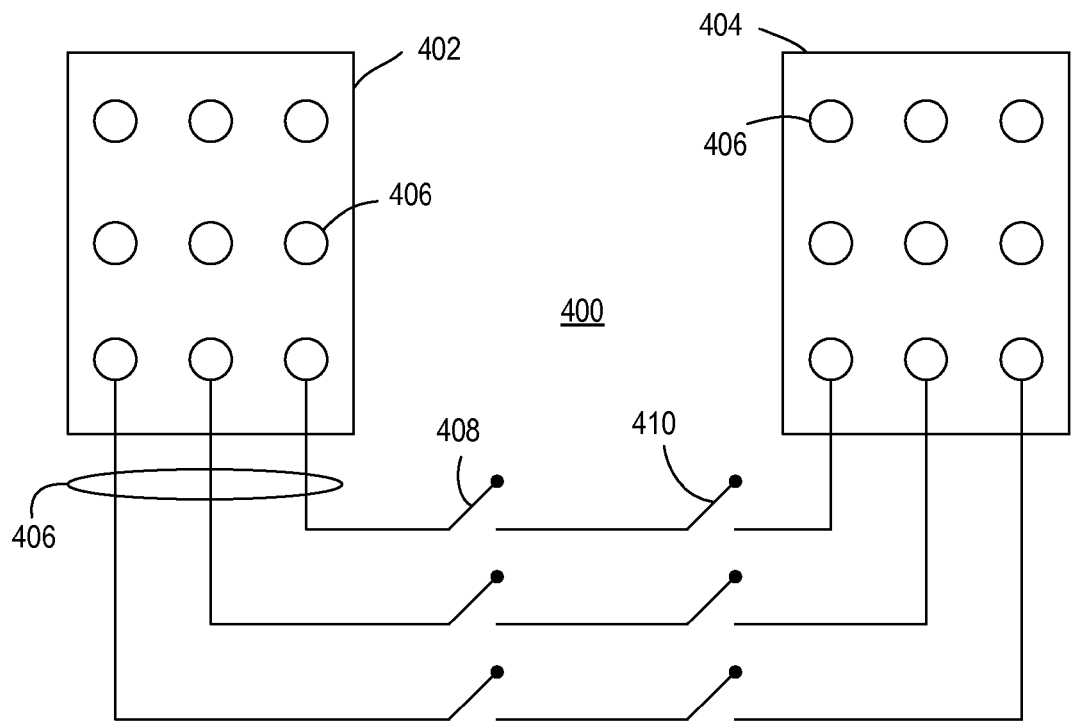
FIG. 4 is a block diagram depicting an exemplary embodiment of dedicated routing resources between a pair of interface tiles in accordance with one or more aspects of the invention.

FIG. 4 is a block diagram depicting an exemplary embodiment of dedicated routing resources between a pair 400 of PHI tiles in accordance with one or more aspects of the invention. The pair 400 includes a PHI tile 402 and a PHI tile 404. The PHI tiles 402 and 404 include pins 406. For clarity, elements in the PHI tiles 402 and 404 other than the pins 406 are omitted from FIG. 4 (such elements are described above in connection with FIG. 3). The PHI tiles 402 and 404 are coupled by a plurality of dedicated routing resources 406 (e.g., three are shown). In some embodiments, each of the dedicated routing resources 406 comprises a bi-directional digital link between pins 406 of the PHI tiles 402 and 404. The dedicated routing resources 406 may be programmable. That is, each of the dedicated routing resources 406 may include conductor segments serially coupled by switches 408 and 410. The switch 408 isolates the PHI tile 402 from wire loading when the dedicated routing resource is not used. The switch 410 isolates the PHI tile 404 from wire loading when the dedicated routing resource is not used. Each of the switches 408 and 410 may be controlled by programmable logic in the FPGA (e.g., CLB logic) or by configuration memory cells, for example.

In the embodiment shown, each of the dedicated routing resources 406 is a direct connection between pins of the PHI tiles 402 and 404. In other embodiments, one or more of the dedicated routing resources 406 may have a plurality of fan-outs. That is, a single pin of a PHI tile may be coupled to multiple pins of another PHI tile via multiple fan-outs of a dedicated routing resource. Each of the fan-outs preferably includes a switch to isolate the respective PHI tile.

In other embodiments, the dedicated routing resources 406 comprise analog or RF links between pins 406 of the PHI tiles 402 and 404 (signal and return paths). In such embodiments, the switches 408 and 410 may be designed to provide 50 ohm series terminations, for example. The dedicated routing resources 406 may be formed by 50 ohm co-planer transmission lines. The transmission lines may be implemented using a global interconnection layer on the FPGA die. The TDVs coupled to the pins driving analog or RF links can be arranged to provide 50 ohm TDV impedance. Such 50 ohm TDV impedance may be provided by selecting appropriate TDV diameter and pitch and placing ground vias between the signal vias, as is known in the art. In still other embodiments, some of the pins 406 are coupled to dedicated analog or RF routing resources, while other of the pins 406 are coupled to dedicated digital routing resources.

Figure 5:
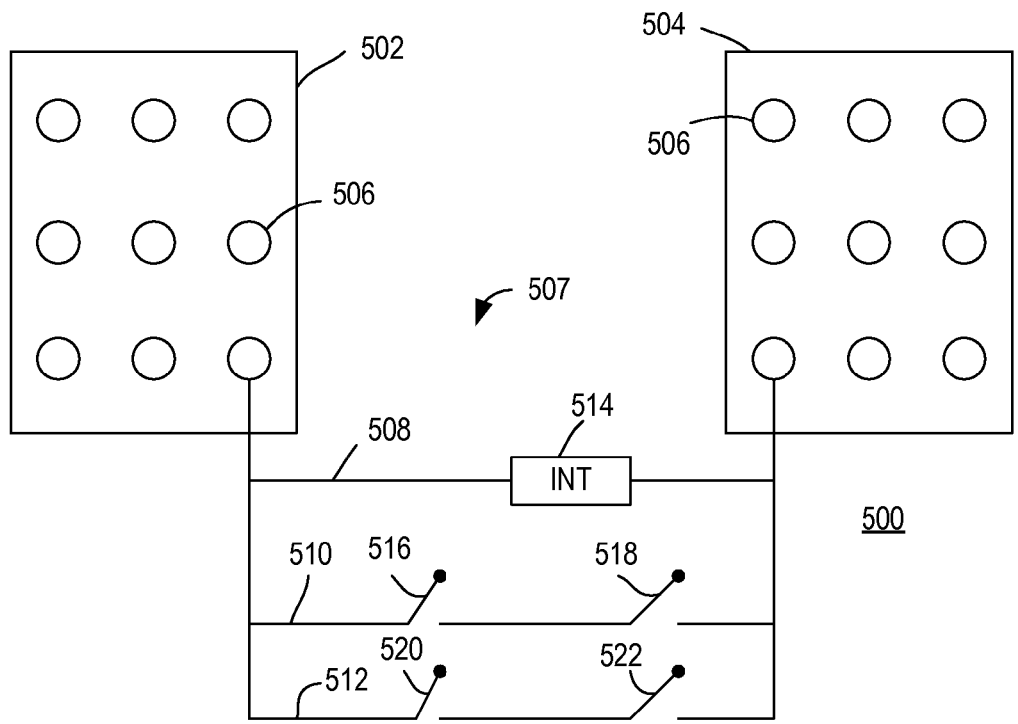
FIG. 5 is a block diagram depicting an exemplary embodiment of programmable routing resources between a pair of interface tiles in accordance with one or more aspects of the invention.

FIG. 5 is a block diagram depicting an exemplary embodiment of programmable routing resources between a pair 500 of PHI tiles in accordance with one or more aspects of the invention. The pair 500 includes a PHI tile 502 and a PHI tile 504. The PHI tiles 502 and 504 include pins 506. For clarity, elements in the PHI tiles 502 and 504 other than the pins 506 are omitted from FIG. 5 (such elements are described above in connection with FIG. 3). The PHI tiles 502 and 504 are coupled by one or more dedicated routing resources 507 (e.g., one is shown). The routing resource 507 comprises a bi-directional path between pins 506 of the PHI tiles 502 and 504. The bi-directional path includes a path 508 through a programmable interconnect element INT of the conventional FPGA programmable interconnect, a digital resource path 510, and an analog/RF resource path 512. The digital resource path 510 and the analog/RF resource path 512 comprise dedicated routing resources, as described above. The path 508 includes one or more programmable switches 514 of the FPGA interconnect. The path 510 includes switches 516 and 518 for isolating the PHI tiles 502 and 504, respectively. The path 512 includes switches 520 and 522 for isolating the PHI tiles 502 and 504, respectively. The switches 520 and 522 may be designed to provide 50 ohm series terminations. In this manner, the dedicated routing resource 507 is programmable to be a dedicated digital resource, a dedicated analog/RF resource, or a conventional programmable resource of the FPGA. The dedicated routing resource 507 may be configured using configuration memory cells in the FPGA, for example.

Figure 6:
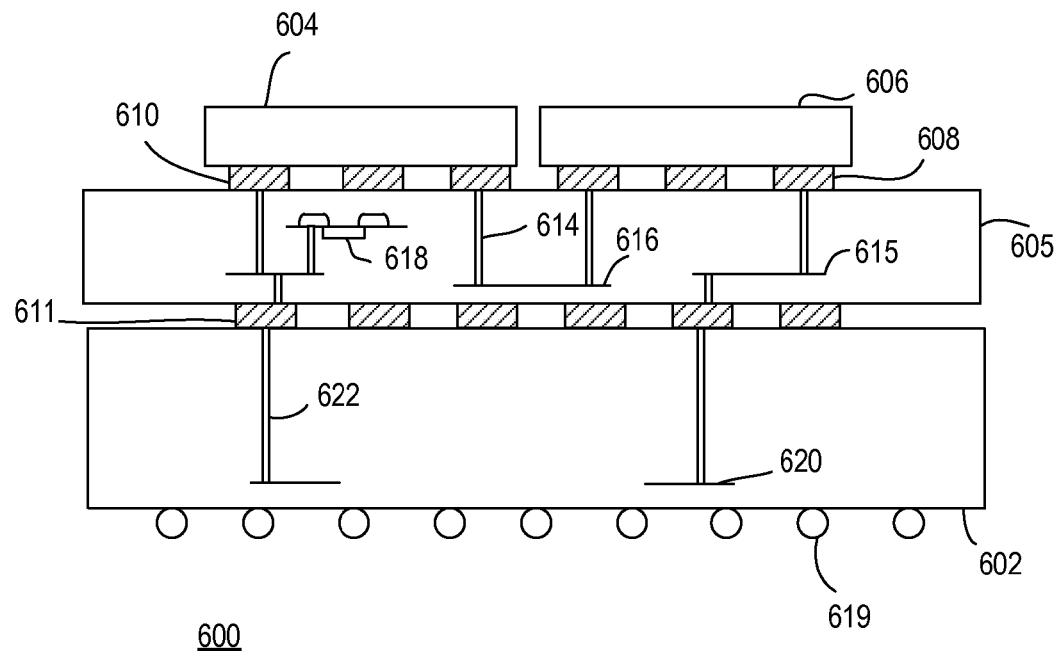
FIG. 6 is a cross-sectional view showing an exemplary embodiment of a second semiconductor device in accordance with one or more aspects of the invention.

FIG. 6 is a cross-sectional view showing an exemplary embodiment of a second semiconductor device 600 in accordance with one or more aspects of the invention. The semiconductor device 600 includes an FPGA die 602, a second die 604, a third die 606, and an interposer 605. The FPGA die 602 may be configured in accordance with the FPGA architecture 100 shown in FIG. 1, for example. Each of the second die 604 and the third die 606 may comprise any type of digital, analog, or mixed-signal IC. The second die 604 and the third die 606 are vertically stacked on the interposer 605, which is in turn stacked on the FPGA die 602. In some embodiments, each of the die 602, 604, and 606 is configured for face-down mounting in flip-chip fashion. Thus, the face side of the second die 604, and the face side of the third die 606, may be mounted to the interposer 605, which is mounted to the backside of the FPGA die 602.

In particular, each of the second die 604 and the third die 606 includes circuitry formed on a semiconductor substrate. The second die 604 and the third die 606 also include conductive interconnect formed over the circuitry, as is conventionally known in the art. The interposer 605 includes an array of contacts 610 and an array of contacts 608, each formed on the backside thereof. The second die 604 is electrically and mechanically coupled to the contacts 610. The third die 606 is electrically and mechanically coupled to the contacts 608. The FPGA die 602 includes an array of contacts 611 formed on the backside thereof. The interposer 605 is electrically and mechanically coupled to the contacts 611. The FPGA die 602 includes circuitry formed on a semiconductor substrate and conductive interconnect formed over the circuitry (portion 620 of the conductive interconnect is shown). The FPGA die 602 also includes TDVs 622 and an array of bump contacts 619 formed on the face side for flip-chip mounting to a carrier.

In some embodiments, the interposer 605 comprises a silicon substrate having one or more layers of conductive interconnect formed thereon (portion 615 of conductive interconnect is shown). The interposer 605 also includes a plurality of TDVs extending from the backside thereof to the conductive interconnect on the face side thereof. For example, TDVs 614 are shown. The interposer 605 may be configured to provide routing resources between the second die 604 and the third die 606 (e.g., path 616). In some embodiments, the interposer 605 includes active circuitry defined thereon (represented by transistor 618). The active circuitry may include switches, level translation circuits, signal conditioning circuits, and the like. In such case, the routing resources may be programmable, such as the dedicated routing resources described above (either digital or analog resources with switches for isolation). Additionally or alternatively, the interposer 605 may be configured to provide routing resources between the second die 604 and the FPGA die 602, and/or between the third die 606 and the FPGA die 602.

The use of the interposer 605 facilitates the integration and stacking of any off-the-shelf die with the FPGA. The interposer 605 provides routing resources for the stacked die, obviating the need to provide such resources in the FPGA die 602. Since the interposer 605 can be fabricated separately from the PHI die or the FPGA die, a more conventional fabrication technology can be used to reduce the implementation costs thereof.

In other embodiments, the interposer 605 may comprise an optically-enabled interposer having embedded optical transmitters/receivers, embedded optical/electrical converters, embedded optical waveguides, and the like. Thus, the interposer 605 may facilitate optical communications between multiple ICs, including between IC(s) and the FPGA.

In present state-of-the-art FPGAs, the interconnection resources (i.e., the number of double, hex, and long wires) per CLB are identical for all array sizes. The number of wiring resources is chosen to guarantee routability in large FPGAs. One drawback of this approach is the inclusion of more routing resources than necessary in smaller FPGAs. In accordance with one aspect of the invention, die stacking techniques can be used to reduce the routing overhead in smaller FPGAs and provide additional interconnection resources on-demand to meet the routability requirements of larger FPGAs. Thus, in some embodiments, an FPGA die may be implemented with PHI tiles and fewer routing resources than a conventional FPGA device. The PHI tiles are configured with dedicated routing resources, as described above. As a result, the FPGA die may be smaller than conventional FPGA devices, resulting in lower die costs.

Figure 7:
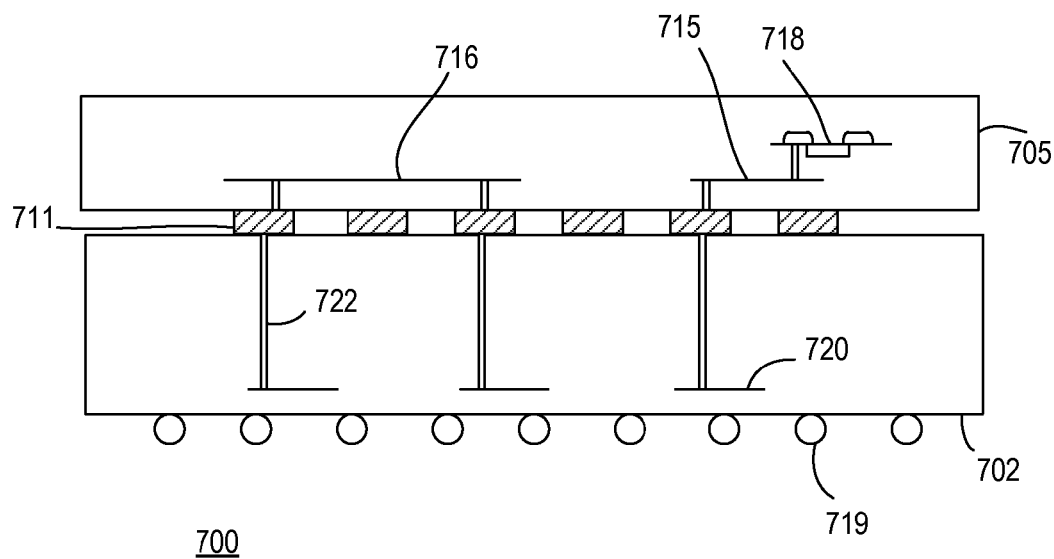
FIG. 7 is a cross-sectional view showing an exemplary embodiment of a third semiconductor device in accordance with one or more aspects of the invention.

FIG. 7 is a cross-sectional view showing an exemplary embodiment of a third semiconductor device 700 in accordance with one or more aspects of the invention. The semiconductor device 700 includes an FPGA die 702 and an interposer 705. The FPGA die 702 may be configured in accordance with the FPGA architecture 100 shown in FIG. 1, for example. The interposer 705 is vertically stacked on the FPGA die 702. In some embodiments, the interposer 705 is configured for face-down mounting in flip-chip fashion. Thus, the face side of the interposer 705 may be mounted to the backside of the FPGA die 702.

In some embodiments, the interposer 705 comprises a silicon substrate having one or more layers of conductive interconnect formed thereon (portion 715 of conductive interconnect is shown). The FPGA die 702 includes an array of contacts 711 formed on the backside thereof. The interposer 705 is electrically and mechanically coupled to the contacts 711. The FPGA die 702 includes circuitry formed on a semiconductor substrate and conductive interconnect formed over the circuitry (portion 720 of the conductive interconnect is shown). The FPGA die 702 also includes TDVs 722 and an array of bump contacts 719 formed on the face side for flip-chip mounting to a carrier.

The interposer 705 may be configured to provide routing resources between PHI tiles in the FPGA die 702 (e.g., path 716). In some embodiments, the interposer 705 includes active circuitry defined thereon (represented by transistor 718). The active circuitry may include switches and the like. In such case, the routing resources may be programmable, such as the dedicated routing resources described above (either digital or analog resources with switches for isolation). The interposer 705 provides routing resources for the FPGA, obviating the need to provide such resources in the FPGA die 702. Since the interposer 705 can be fabricated separately from the FPGA die, a more conventional fabrication technology can be used to reduce the implementation costs thereof.

In other embodiments, the interposer 705 may comprise an optically-enabled interposer having embedded optical transmitters/receivers, embedded optical/electrical converters, embedded optical waveguides, and the like. Thus, the interposer 705 may facilitate optical communications between interface tiles in the FPGA.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof.

What is claimed is:

1. A semiconductor device, comprising:
a first integrated circuit die comprising a programmable integrated circuit that includes first and second interface tiles, the first interface tile being in electrical communication with a first array of pins on the first integrated circuit die and the second interface tile being in electrical communication with a second array of pins on the first integrated circuit die; and
at least one dedicated routing resource formed on the first integrated circuit die between the first interface tile and the second interface tile, the at least one dedicated routing resource configured to couple at least one pin of the first array of pins to at least one pin of the second array of pins,
wherein the first interface tile facilitates electrical communication with a second integrated circuit die stacked on the first integrated circuit die.

2. The semiconductor device of claim 1, further comprising:
the second integrated circuit die vertically stacked on the first integrated circuit die in electrical communication with the first array of pins; and
a third integrated circuit die vertically stacked on the first integrated circuit die in electrical communication with the second array of pins.

3. The semiconductor device of claim 1, wherein the at least one dedicated routing resource comprises at least one of: a dedicated digital routing resource; a dedicated analog routing resource; or a dedicated radio frequency (RF) routing resource.

4. The semiconductor device of claim 1, wherein the at least one dedicated routing resource includes a first switch and a second switch for isolating the first interface tile and the second interface tile, respectively.

5. The semiconductor device of claim 4, wherein each of the first switch and the second switch provides a 50 ohm series termination.

6. The semiconductor device of claim 1, wherein the first array of pins includes a first pin, and wherein the first pin is coupled to one or more of: the at least one dedicated routing resource; and a programmable resource of programmable interconnect formed on the first integrated circuit die.

7. The semiconductor device of claim 1, wherein the at least one dedicated routing resource is independent of programmable interconnect formed on the first integrated circuit die.

8. A semiconductor device, comprising:
a first integrated circuit die comprising a programmable integrated circuit;
an interposer mounted on the first integrated circuit die;
a second integrated circuit die vertically stacked on the interposer;
a third integrated circuit die vertically stacked on the interposer; and
at least one dedicated routing resource formed on the interposer configured to electrically couple the second integrated circuit and the third integrated circuit.

9. The semiconductor device of claim 8, further comprising:
conductive interconnect, formed on the interposer, configured to electrically couple at least one of the second integrated circuit die or the third integrated circuit die to the first integrated circuit die.

10. The semiconductor device of claim 8, wherein the interposer includes active devices fabricated therein.

11. The semiconductor device of claim 10, wherein the active devices are configured to implement switches for the at least one dedicated routing resource.

12. The semiconductor device of claim 8, wherein the at least one dedicated routing resource comprises at least one of: a dedicated digital routing resource; a dedicated analog routing resource; or a dedicated radio frequency (RF) routing resource.

13. The semiconductor device of claim 8, wherein the at least one dedicated routing resource includes a first switch and a second switch for isolating the second integrated circuit die and the third integrated circuit die, respectively.

14. The semiconductor device of claim 13, wherein each of the first switch and the second switch provides a 50 ohm series termination.

15. A semiconductor device, comprising:
an integrated circuit die comprising a programmable integrated circuit that includes a first interface tile and a second interface tile;
an interposer mounted on the integrated circuit die; and
at least one dedicated routing resource formed on the interposer configured to electrically couple the first interface tile and the second interface tile.

16. The semiconductor device of claim 15, wherein the interposer includes active devices fabricated therein.

17. The semiconductor device of claim 16, wherein the active devices are configured to implement switches for the at least one dedicated routing resource.

18. The semiconductor device of claim 15, wherein the at least one dedicated routing resource comprises at least one of: a dedicated digital routing resource; a dedicated analog routing resource; or a dedicated radio frequency (RF) routing resource.

19. The semiconductor device of claim 15, wherein the at least one dedicated routing resource includes a first switch and a second switch for isolating the first interface tile and the second interface tile, respectively.

20. The semiconductor device of claim 19, wherein each of the first switch and the second switch provides a 50 ohm series termination.

* * * * *